United States Patent [19]
Pappert et al.

[11] Patent Number: 5,912,562
[45] Date of Patent: Jun. 15, 1999

[54] QUIESCENT CURRENT MONITOR CIRCUIT FOR WAFER LEVEL INTEGRATED CIRCUIT TESTING

[75] Inventors: Bernard J. Pappert; William C. Bruce, Jr., both of Austin, Tex.

[73] Assignee: Motorola Inc., Austin, Tex.

[21] Appl. No.: 08/795,027

[22] Filed: Feb. 4, 1997

[51] Int. Cl.$^6$ ................................................. G01R 31/28
[52] U.S. Cl. .......................................... 324/765; 324/763
[58] Field of Search ............................... 324/73.1, 758.1, 324/763, 765; 371/15.1, 22.1, 22.3, 22.6; 257/40, 48; 438/14, 17

[56] References Cited

U.S. PATENT DOCUMENTS

| | | | |
|---|---|---|---|
| 5,317,457 | 5/1994 | Lipp ........................................ | 324/73.1 |
| 5,389,556 | 2/1995 | Rostoker et al. .......................... | 437/8 |
| 5,442,282 | 8/1995 | Rostoker et al. ..................... | 324/158.1 |

OTHER PUBLICATIONS

Hsue, et al., "Built–In Current Sensor For IDDQ Test In CMOS," International Test Conf., pp. 635–641 (1993). (unavailable month).

Rius, et al., "Proportional BIC Sensor For Current Testing," Electronic Testing: Theory and Appl. vol. 3; pp. 387–396 (1992). (unavailable month).

Rubio, et al., "A Built–In Quiescent Current Monitor For CMOS VLSI Circuits," Eur. Design and Test Conf., pp. 581–585 (1995). (unavailable month).

Maly, et al., "Built In Current Testing," J. Solid–State Circuits, vol. 27, No. 3., pp. 425–428 (1992). (unavailable month).

Keating, et al., "A New Approach To Dynamic IDD Testing, " International Test Conf., pp. 316–321 (1987). (unavailable month).

*Primary Examiner*—Vinh P. Nguyen
*Attorney, Agent, or Firm*—Daniel D. Hill

[57] ABSTRACT

A current monitor circuitry for detecting defects in a semiconductor device through performance of quiescent current testing. The circuitry for performing quiescent current testing may be implemented on chip or in an expendable portion of the wafer or a combination of both. In one embodiment, a quiescent current monitor unit interfaces with the circuit to be tested. The quiescent current monitor includes a sense amplifier and a level detector. The sense amplifier senses for a voltage differential and the level detector checks for a predetermined voltage rise. The voltage differences may be used for verification of specified circuit operations.

24 Claims, 3 Drawing Sheets

QUIESCENT CURRENT MONITOR CIRCUIT FOR WAFER LEVEL INTEGRATED CIRCUIT TESTING

RELATED CO-PENDING APPLICATIONS

The present application is related to the following U.S. patent application:

"Method And Apparatus For Performing Operative Testing on an Integrated Circuit", invented by Bernard Pappert, et al., Attorney Docket No. SC-90217A, filed concurrently herewith, and assigned to the assignee hereof.

FIELD OF THE INVENTION

This invention relates generally to circuits, and more particularly, to a current monitor circuit.

BACKGROUND OF THE INVENTION

When a complimentary metal oxide semiconductor (CMOS) circuit is in a quiescent state, ideally no current is drawn from the power source by the circuit. A defective CMOS logic device may tend to draw current from the power source. In theory, it is possible to characterize a CMOS logic device by measuring the quiescent current IDDQ and find such a defective device. Although a defective CMOS device may exhibit abnormal behavior in its transient current, it is generally anticipated that the abnormal transient current due to a defective individual gate will be masked by the overall circuit transient current. Of course it is possible to build a current detector for almost every logic gate so that an abnormal transient current can become detectable and the test speed improved. However, such an approach would require much overhead and is probably impractical in application.

There is much information regarding various prior art quiescent current testing methods, including: "A Built-In Current Monitor For CMOS VLSI Circuits", by A. Rubio, et al., published by IEEE in 1995 at the European Design and Test Conference held in Paris, France; "Built-in Current Testing, by W. Maly and M. Patyra, published in the IEEE Journal of Solid State Circuits, Vol. 27, No. 3, March 1992; "Proportional BIC Sensor for Current Testing" by J. Rius and J. Figueras, published in Journal of Electronic Testing, Theory and Applications, 1992; and "Built-In Current Sensor for IDDQ Test In CMOS" by C. Hsue and C. Lin, published by AT&T Bell Laboratories in Princeton, N.J., in the International Test Conference 1993.

As seen in the prior art, quiescent current testing is efficient in CMOS digital circuits, offering high coverage levels for detecting significant defects and requiring only a reduced number of test vectors. On-chip built-in current sensors have some advantages over the off-chip alternatives, as on-chip sensors are able to detect defective quiescent current levels with more discrimination and at relatively higher test speeds. The design of reliable circuits has become a key point in the application of current testing techniques. Quiescent current testing circuits have been evaluated for use as built-in current sensors for testing very large scale integrated (VLSI) CMOS circuits. A significant set of sensor developments are available.

The current of a static CMOS cell is not constant through time. When an output clock transition occurs, a peak of IDD current is observed. This peak is due to the charging and discharging of the load capacitance at the output circuit nodes and additionally to the overlap current through the PMOS and NMOS transistors due to the circuit changing state. When the state transition is completed, the cell is in the quiescence state and, in practice, IDD is near to zero and remains in this range until a new transition occurs. The quiescent current is very sensitive to circuit degradation and other defects which generate IDDQ many orders of magnitude greater than the normal IDDQ. This characteristic is used to detect defects by use of IDDQ current sensor.

Basically the measurement of the defective current of a device is obtained through observation of the degraded level of the device VDD. This is due to the discharge of the parasitic capacitance of the power supply line of the device, VDD. Typical IDDQ current measurements require an additional VDD pad or a pseudo VDD (PVDD) to supply dynamic current through a switch. Additionally, digital signals are used to determine a delay time indicative of a defective current. Note that a monitor circuit should be repeated for every VDD pin on the chip.

Quiescent current measurements provide information regarding many aspects of the CMOS device. It is desirable to streamline device testing and specifically the quiescent current testing and minimize the hardware associated with the quiescent current testing as well as the time required for such tests. It is also desirable to expand quiescent testing and so reduce the number of tests required to guarantee fault coverage. The following description relates to quiescent current testing, its applications to device testing, and wafer level test circuitry to implement such testing.

DESCRIPTION OF A PREFERRED EMBODIMENT

Generally, the present invention provides a current monitor circuitry for detecting defects in a semiconductor device through performance of quiescent current testing. The present invention offers circuitry for performing quiescent current testing which may be implemented on chip or in an expendable portion of the wafer or a combination of both. In one embodiment of the invention the expendable portion is the unused portion of the wafer.

Specifically, the present invention can be described with reference to the FIG. 1. The FIG. 1 illustrates, in schematic diagram form, a current monitor circuit 20 in accordance with the present invention.

Figure 1:
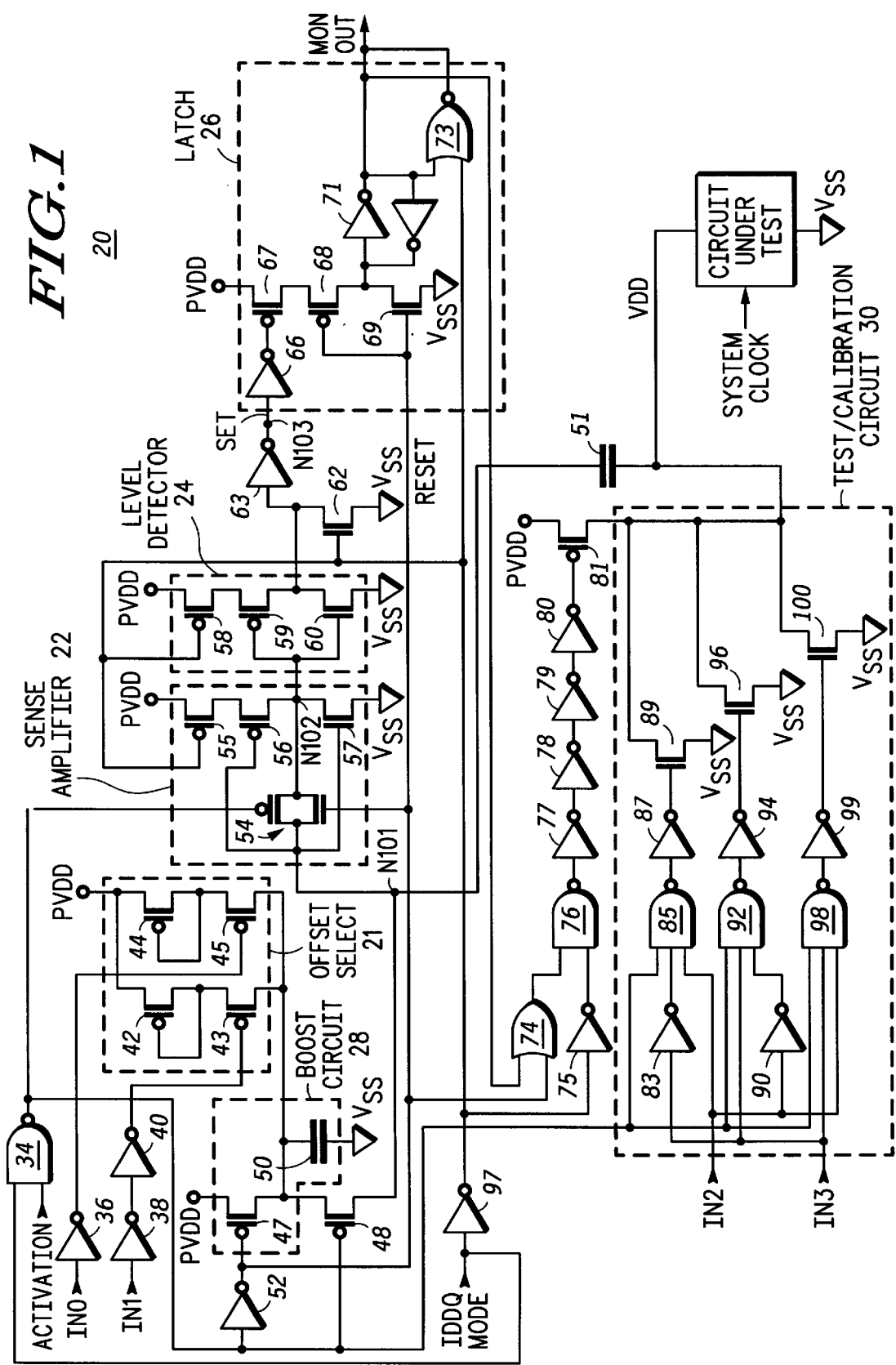
FIG. 1 illustrates, in schematic diagram form, a current monitor circuit in accordance with the present invention.
Figure 2:
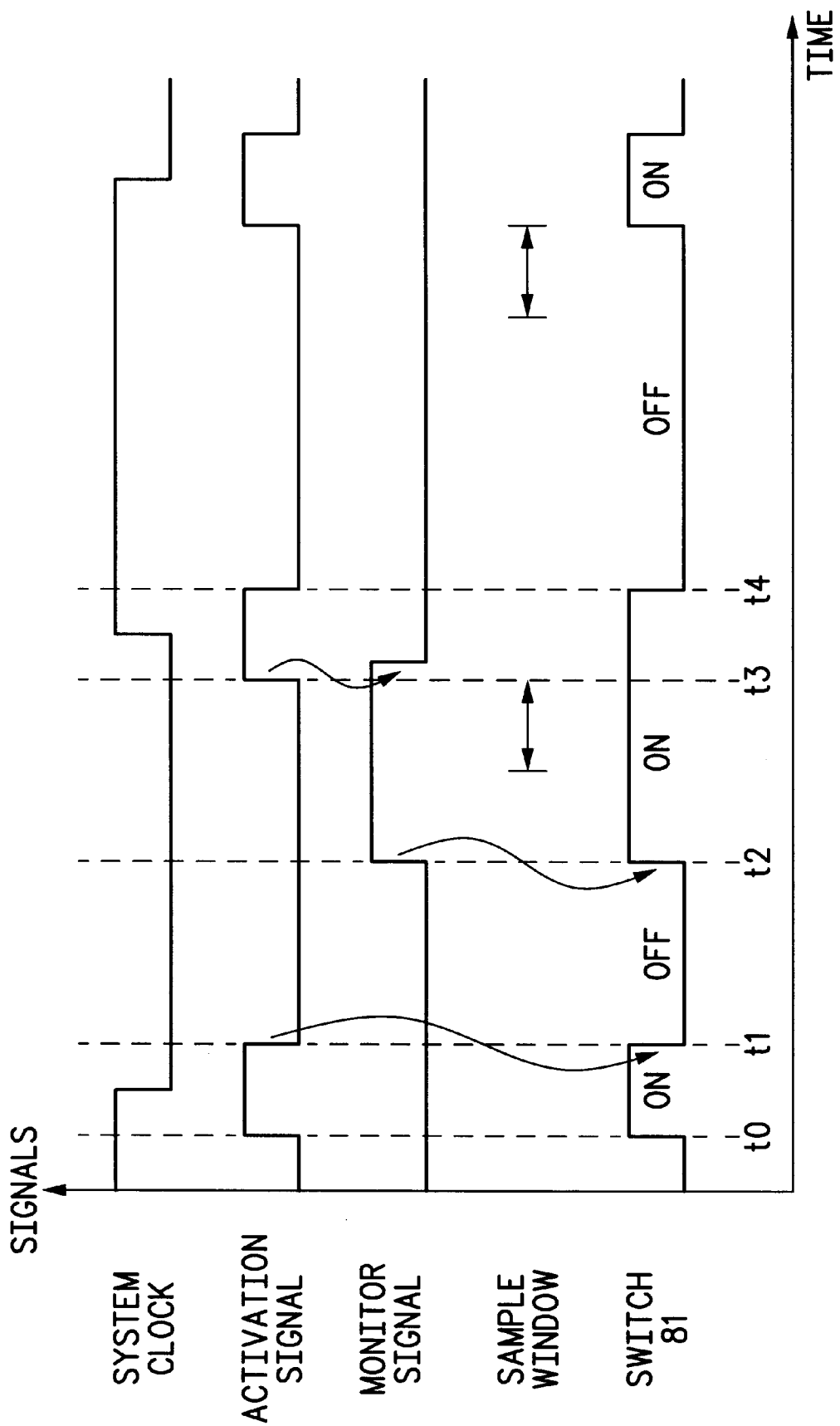
FIG. 2 illustrates, in timing diagram form, the timing of signals in accordance with one embodiment of the present invention as illustrated in FIG. 1.

FIG. 2 illustrates a timing diagram of various signals of the current monitor circuit 20 of FIG. 1. At time $t_1$ the activation signal goes from a logic high level to a logic low level. Prior to the activation signal going low, offset select circuit 21 sets the sense node labeled N101 to a predetermined voltage, the predetermined voltage being above a switch point of sense amplifier 22. The offset select circuit 21 is coupled to node N101 via P-channel transistor 48. As the activation signal goes high, the voltage at the gate of P-channel transistor 48 goes low causing P-channel transistor 48 to become conductive. The time it takes for sense node N101 to drop to a predetermined voltage level after activation goes low is then used to determine whether circuit under test (CUT) 32 has a defect which would cause CUT 32 to fail.

Figure 3:
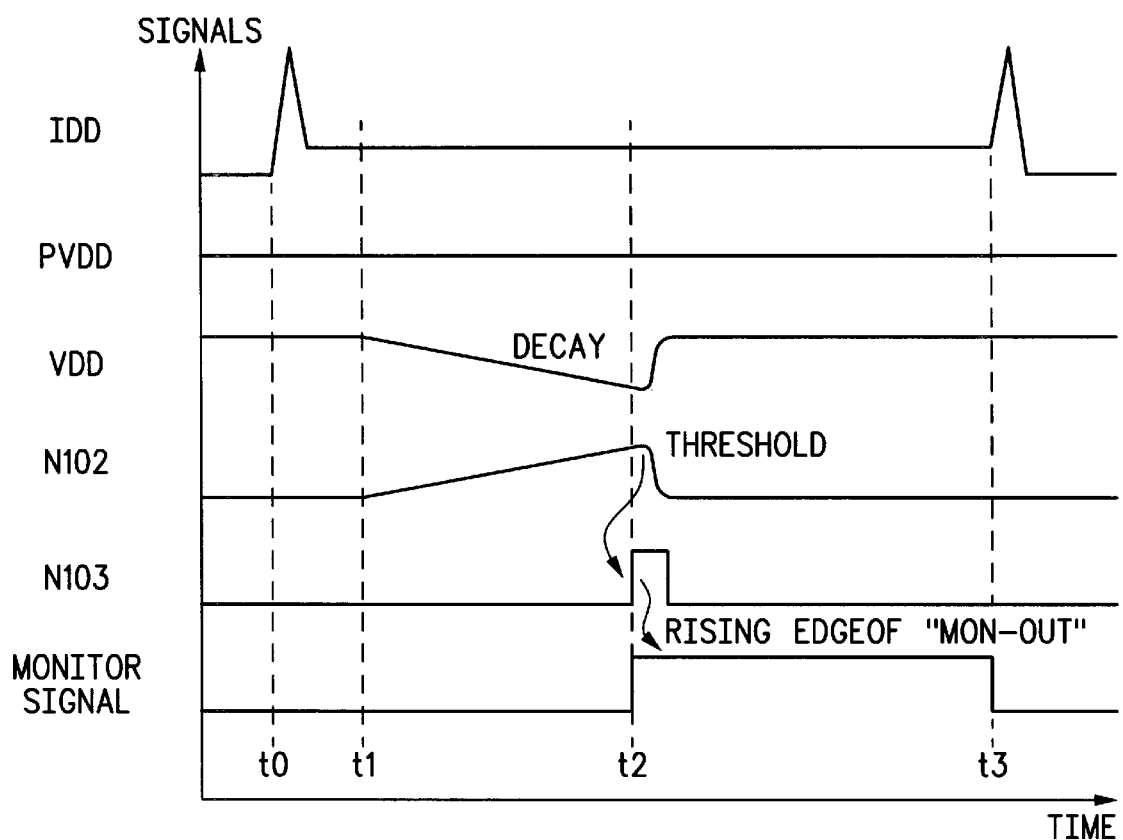
FIG. 3 illustrates, in timing diagram form, the timing of signals in accordance with one embodiment of the present invention as illustrated in FIGS. 1 and 2.

The output terminal of the inverter comprising P-channel transistor 56 and N-channel transistor 57 defines a node N102. As the sense voltage at node N101 is decreasing, the voltage at N102 is increasing. The increasing voltage at N102 is illustrated in FIG. 3 by the wave form labeled N102 respectively. As the voltage at N102 reaches a predetermined threshold, level detector 24 detects that the predetermined threshold voltage has been reached. In response the output of the level detector 24 decreases causing the output of inverter 63 to increase. The output of inverter 63 is labeled N103 and is illustrated in FIG. 3.

Node N103 forms a set terminal for latch 26. The control terminal of N-channel transistor 69 forms a reset terminal for latch 26. As the output signal of inverter 63 increases, the output of inverter 66 decreases causing P-channel transistor 67 to become conductive. The output of the inverter consisting of P-channel transistor 68 and N-channel 69 will be at a logic high level. A weak latch formed by cross coupled inverters will have a logic low output causing the monitor output signal labeled MONOUT to be a logic high.

The time it takes for MONOUT to become a logic high is used to determine whether circuit under test 32 is defective. Monitor output signal MONOUT is provided to an input terminal of OR gate 74. OR gate 74 along with NAND gate 76 and a series of inverters 77–80 are used to control P-channel transistor 81. A logic high monitor output signal will cause P-channel transistor 81 to become conductive. When P-channel transistor 81 is conductive the node labeled VDD is pulled to a voltage equal to approximately the voltage of PVDD. Capacitor 51 is coupled between sense node N101 and node VDD. Capacitor 51 functions to provide a predetermined voltage difference between VDD and sense node N101. This allows the inverter in sense amplifier 22 to operate in the high gain region of the sense amplifier. This allows the small voltage change in sense node N101 to become a large voltage change at the output node N102. Current monitor 20 also receives a low power mode signal labeled IDDQ mode.

During normal operation of current monitor 20, IDDQ mode is at a logic high level. During the low power mode IDDQ is at a logic low level causing P-channel transistor 55 and P-channel transistor 58 of level detector 24 to be nonconductive. In addition, N-channel transistor 62 is conductive, which pulls the output of level detector 24 to a logic low level. The initialization voltage at sense node N101 can be adjusted using offset select circuit 21. The offset is externally controllable by IN0 and IN1, as both P channel transistors 43 and 45 can be off, or only transistor 43 on, or only transistor 45 on, or both transistors 43 and 45 on.

FIG. 2 illustrates a timing diagram associated with one embodiment of the present invention illustrated in FIG. 1. Starting at time to, an activation signal transitions to a high level, which, according to FIG. 1, results in the resetting latch 26 and causes invertor 80 output to go low and turn on P channel switch 81. At this time the monitor signal is low. At time $t_1$ activation signal goes low serving to turn switch 81 off, and begin the delay period to be monitored. The monitor delay period ends at time $t_2$ when the monitor signal goes high indicating a defect. Monitor signal transitioning high turns switch 81 on for recovery. Note that the monitor signal going high indicates a defect in CUT 32.

Continuing with the timing diagram of FIG. 2, shortly after the activation signal goes high, time $t_3$, the monitor signal goes low again. Note that switch 81 remains on until time $t_4$. At time $t_4$, the activation signal goes low turning switch 81 off. After time $t_4$, the activation signal remains low and switch 81 remains off. As indicated across the top of the timing diagram of FIG. 2, in the illustrated example, time $t_2$ represents the time when a quiescent IDD is above the desired IDDQ threshold level. For the period following time $t_4$, quiescent IDD is less than the desired IDDQ threshold level. Note that at the end of each activation signal cycle the monitor signal is available for testing during the sample window.

FIG. 3 is related to FIG. 2, and illustrates the associated voltages PVDD, and VDD, the current IDD, as well as the output of amplifier 22, N103, and the monitor signal (MONOUT). There is a general correspondence of the timing diagram of FIG. 3 to the timing diagram shown in FIG. 2. At time $t_0$ the activation signal is high and switch 81 is turned on. At this point there is a corresponding spike in IDD, seen in FIG. 3. Beginning at time $t_1$, the VDD level begins to decay. From time $t_1$, the level output of amplifier 22 begins to increase and reaches a threshold level at time $t_2$. Attainment of the threshold level indicates a failure detection, and results in a low output of level detector 24, with the resultant high monitor signal. Note that the monitor signal remains high until time $t_3$. The level detector 24 output is pulsed low at time $t_2$ and goes high during the period from time $t_2$ to time $t_3$.

Referring to FIGS. 1, 2, and 3, the timing diagrams illustrating the operation of one embodiment of the present invention are detailed. In operation, current monitor circuit 20 is enabled by the activation signal. At the beginning of the monitor signal cycle, which begins at the falling edge of the activation signal, power is disconnected from PVDD by the switch 81, which in one embodiment is a P-channel switch transistor. In the presence of an IDDQ fault, VDD decays through the anomalous current path, and the amplifier 22 amplifies the difference between the original VDD level and the decayed VDD level. The level detector 24 pulses low to SET the IDDQ monitor latch 26. The SET latch 26 then turns switch 81 on to prevent further decay of VDD. The rising edge of the activation signal terminates the monitor signal cycle and latch 26 is RESET in preparation for the next cycle.

The present invention may be implemented on the expendable portion of a wafer, allowing wafer level testing without necessarily incurring substantial additional Silicon area on the die. The current monitor circuit of the present invention may be applied to multiple circuits under test, and at wafer level one current monitor circuit may be applicable to multiple die.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A current monitor circuit, comprising:
   a sense amplifier having a sense node and an output terminal, the sense amplifier for sensing a voltage differential between a voltage at the sense node and a voltage at a first power supply voltage terminal;
   a level detector having an input terminal coupled to the output terminal of the sense amplifier, for detecting a predetermined voltage rise at the output terminal of the sense amplifier, and in response, providing a monitor output signal at an output terminal;

a latch circuit having an input terminal coupled to the output terminal of the level detector for receiving the monitor output signal, the latch circuit for temporarily storing the monitor output signal and having an output terminal for providing the monitor output signal; and an offset select circuit, coupled to the sense node, for presetting the voltage at the sense node to a predetermined voltage level.

2. The current monitor circuit of claim 1, further comprising a capacitive element for coupling the sense node to a circuit under test.

3. The current monitor circuit of claim 2, further comprising a test circuit, the test circuit coupled to the capacitive element for testing functionality of the current monitor circuit.

4. The current monitor circuit of claim 2, further comprising a calibration circuit coupled to the capacitive element, the calibration circuit for calibrating a time between an activation signal being asserted and the monitor output signal being provided.

5. The current monitor circuit of claim 1, wherein the predetermined voltage level is a predetermined voltage above a switch point of the sense amplifier.

6. The current monitor circuit of claim 1, wherein the sense amplifier comprises:

a switch having an input terminal coupled to the sense node, a control terminal for receiving a first control signal, and an output terminal;

a first transistor having a first current electrode coupled to the first power supply voltage terminal, a control electrode for receiving a second control signal, and a second current electrode;

a second transistor having a first current electrode coupled to the second current electrode of the first transistor, a control electrode coupled to the sense node, and a second current electrode; and a third transistor having a first current electrode coupled to the second current electrode of the second transistor, a control electrode coupled to the switch, and a second current electrode coupled a second power supply voltage terminal.

7. The current monitor circuit of claim 1, wherein the latch circuit has a second input terminal for receiving a control signal, the latch circuit being reset to a predetermined logic state in response to the control signal.

8. The current monitor circuit of claim 1, wherein the offset select circuit comprises:

a first transistor having a first current electrode coupled to the first power supply voltage terminal, and a control electrode and a second current electrode coupled together;

a second transistor having a first current electrode coupled to the second current electrode of the first transistor, a control electrode for receiving a first select signal, and a second current electrode;

a third transistor having a first current electrode coupled to the first power supply voltage terminal, and a control electrode and a second current electrode coupled together;

a fourth transistor having a first current electrode coupled to the second current electrode of the third transistor, a control electrode for receiving a second select signal, and a second current electrode; and wherein the offset select circuit provides a predetermined number of predetermined voltage levels for presetting the voltage of the sense node.

9. The current monitor circuit of claim 1, further comprising a boost circuit, the boost circuit coupled to the sense node, for boosting the sense node above a switch point of the sense amplifier.

10. The current monitor circuit of claim 9, wherein the boost circuit comprises:

a first transistor having a first current electrode coupled to the first power supply voltage terminal, a control electrode for receiving a first control signal, and a second current electrode coupled to the offset select circuit; and a capacitive element having a first plate electrode coupled to the second current electrode of the first transistor, and a second plate electrode coupled to a second power supply voltage terminal.

11. The current monitor circuit of claim 1, wherein the monitor output signal is used to reset a voltage supplied to a circuit under test to about the first power supply voltage.

12. An integrated circuit, comprising:

a current monitor circuit for detecting a high current defect in the integrated circuit, the current monitor circuit comprising:

a sense amplifier having a sense node and an output terminal, the sense amplifier for sensing a voltage differential between a voltage at the sense node and a voltage at a first power supply voltage terminal;

a level detector having an input terminal coupled to the output terminal of the sense amplifier, for detecting a predetermined voltage rise at the output terminal of the sense amplifier, and in response, providing a monitor output signal at an output terminal;

a latch circuit having an input terminal coupled to the output terminal of the level detector for receiving the monitor output signal, the latch circuit for temporarily storing the monitor output signal and having an output terminal for providing the monitor output signal;

an offset select circuit, coupled to the sense node, for presetting the voltage at the sense node to a predetermined voltage level; and a capacitive element having a first plate electrode coupled to the sense node, and a second plate electrode, the second plate electrode for being coupled to a circuit under test;

wherein the monitor output signal is used to reset a voltage supplied to the integrated circuit to about a first power supply voltage.

13. The current monitor circuit of claim 12, further comprising a test circuit, the test circuit coupled to the second plate electrode of the capacitive element for testing functionality of the current monitor circuit.

14. The current monitor of claim 12, further comprising a calibration circuit coupled to the second plate electrode of the capacitive element, the calibration circuit for calibrating a time between an activation signal being asserted and the monitor output signal being provided.

15. The current monitor circuit of claim 12, wherein the predetermined voltage level is a predetermined voltage above a switch point of the sense amplifier.

16. The current monitor circuit of claim 12, wherein the sense amplifier comprises:

a switch having an input terminal coupled to the sense node, a control terminal for receiving a first control signal, and an output terminal;

a first transistor having a first current electrode coupled to the power supply voltage terminal, a control electrode for receiving a second control signal, and a second current electrode;

a second transistor having a first current electrode coupled to the second current electrode of the first transistor, a control electrode coupled to the sense node, and a second current electrode; and a third transistor having a first current electrode coupled to the second current electrode of the second transistor, a control electrode coupled to the switch, and a second current electrode coupled to a second power supply voltage terminal.

17. The current monitor circuit of claim 12, wherein the latch circuit has a second input terminal for receiving a control signal, the latch circuit being reset to a predetermined logic state in response to the control signal.

18. The current monitor circuit of claim 12, wherein the offset select circuit comprises:

a first transistor having a first current electrode coupled to the first power supply voltage terminal, and a control electrode and a second current electrode coupled together;

a second transistor having a first current electrode coupled to the second current electrode of the first transistor, a control electrode for receiving a first select signal, and a second current electrode;

a third transistor having a first current electrode coupled to the first power supply voltage terminal, and a control electrode and a second current electrode coupled together; and a fourth transistor having a first current electrode coupled to the second current electrode of the third transistor, a control electrode for receiving a second select signal, and a second current electrode;

wherein the offset select circuit provides a predetermined number of predetermined voltage levels for presetting the voltage of the sense node.

19. The current monitor circuit of claim 12, further comprising a boost circuit, the boost circuit coupled to the sense node, for boosting the sense node above a switch point of the sense amplifier.

20. The current monitor circuit of claim 19, wherein the boost circuit comprises:

a first transistor having a first current electrode coupled to the first power supply voltage terminal, a control electrode for receiving a first control signal, and a second current electrode coupled to the offset select circuit; and a capacitive element having a first plate electrode coupled to the second current electrode of the first transistor, and a second plate electrode coupled to a second power supply voltage terminal.

21. An integrated circuit, comprising:

a current monitor circuit for detecting a high current defect in the integrated circuit, the current monitor circuit comprising:

a sense amplifier having a sense node and an output terminal, the sense amplifier for sensing a voltage differential between a voltage at the sense node and a voltage at a first power supply voltage terminal;

a level detector having an input terminal coupled to the output terminal of the sense amplifier, for detecting a predetermined voltage rise at the output terminal of the sense amplifier, and in response, providing a monitor output signal at an output terminal;

a latch circuit having an input terminal coupled to the output terminal of the level detector for receiving the monitor output signal, the latch circuit for temporarily storing the monitor output signal and having an output terminal for providing the monitor output signal;

an offset select circuit, coupled to the sense node, for providing a predetermined number of predetermined voltage levels, the predetermined voltage levels for presetting the voltage of the sense node; and a capacitive element having a first plate electrode coupled to the sense node, and a second plate electrode, the second plate electrode for being coupled to an integrated circuit under test;

wherein the monitor output signal is used to reset a voltage supplied to the integrated circuit to about the first power supply voltage.

22. The current monitor circuit of claim 21, wherein the offset select circuit comprises:

a first transistor having a first current electrode coupled to the first power supply voltage terminal, and a control electrode and a second current electrode coupled together;

a second transistor having a first current electrode coupled to the second current electrode of the first transistor, a control electrode for receiving a first select signal, and a second current electrode;

a third transistor having a first current electrode coupled to the first power supply voltage terminal, and a control electrode and a second current electrode coupled together; and a fourth transistor having a first current electrode coupled to the second current electrode of the third transistor, a control electrode for receiving a second select signal, and a second current electrode;

wherein the offset select circuit provides a predetermined number of predetermined voltage levels for presetting the voltage of the sense node.

23. The current monitor circuit of claim 21, wherein the sense amplifier comprises:

a switch having an input terminal coupled to the sense node, a control terminal for receiving a first control signal, and an output terminal;

a first transistor having a first current electrode coupled to the first power supply voltage terminal, a control electrode for receiving a second control signal, and a second current electrode;

a second transistor having a first current electrode coupled to the second current electrode of the first transistor, a control electrode coupled to the sense node, and a second current electrode; and a third transistor having a first current electrode coupled to the second current electrode of the second transistor, a control electrode coupled to the switch, and a second current electrode coupled to a second power supply voltage terminal.

24. The current monitor circuit of claim 21, wherein the level detector comprises:

a first transistor having a first current electrode coupled to the first power supply voltage terminal, a control electrode for receiving a control signal, and a second current electrode;

a second transistor having a first current electrode coupled to the second current electrode of the first transistor, a control electrode coupled to the output terminal of sense amplifier, and a second current electrode; and a third transistor having a first current electrode coupled to the second current electrode of the second transistor, a control electrode coupled to the control electrode of the second transistor, and a second current electrode coupled a second power supply voltage terminal.

* * * * *